United States Patent
Shimizu

[11] Patent Number: 5,815,150
[45] Date of Patent: Sep. 29, 1998

[54] DISPLAY APPARATUS

[75] Inventor: Kazuma Shimizu, Tokyo, Japan

[73] Assignee: Canon Kabushiki Kaisha, Tokyo, Japan

[21] Appl. No.: 695,668

[22] Filed: Aug. 8, 1996

Related U.S. Application Data

[63] Continuation of Ser. No. 287,855, Aug. 9, 1994.

[30] Foreign Application Priority Data

Aug. 25, 1993 [JP] Japan .................................. 5-210581

[51] Int. Cl.⁶ ...................................................... G09G 5/00
[52] U.S. Cl. ........................................... 345/339; 345/964
[58] Field of Search .................................... 345/115, 118, 345/119, 120, 127, 129, 130, 131, 339, 964, 348

[56] References Cited

U.S. PATENT DOCUMENTS

| | | | |
|---|---|---|---|
| 4,698,625 | 10/1987 | McCaskill et al. | 345/157 |
| 4,825,390 | 4/1989 | Van Aken et al. | 345/150 |
| 4,829,453 | 5/1989 | Katsuta et al. | 345/127 |
| 5,237,653 | 8/1993 | Noguchi et al. | 345/115 |
| 5,412,775 | 5/1995 | Maeda et al. | 345/120 |

*Primary Examiner*—Kee M. Tung
*Assistant Examiner*—Matthew Luu
*Attorney, Agent, or Firm*—Robin, Blecker & Daley

[57] ABSTRACT

The shapes of a plurality of parts are displayed simultaneously on a display screen. When the shape of one of the parts is designated in a "hide" mode, the display of the shape of this part is inhibited and an icon is displayed in its place. When the icon is designated in a "show" mode, the icon is erased and the shape of the original member is re-displayed.

19 Claims, 14 Drawing Sheets

FIG. 12

| ID(i) | D(i) | GDP(i) | IDP(i) | IDP(i) | WP(i) | WPF(i) | IF(i) | CID(i) |
|---|---|---|---|---|---|---|---|---|
| 1 | 1 | aaa | ddd | 1 | $AD_1$ | 1 | 0 | 4 |
| 2 | 0 | bbb | eee | 1 | $AD_2$ | 1 | 0 | |
| 3 | 1 | ccc | fff | 1 | $AD_3$ | 1 | 0 | |
| 4 | 1 | eee | eee | — | — | — | 1 | 2 |
| ⋮ | ⋮ | ⋮ | ⋮ | ⋮ | ⋮ | ⋮ | ⋮ | ⋮ |

DISPLAY APPARATUS

This is a continuation application under 37 CFR 1.62 of prior application Ser. No. 08/287,855, filed Aug. 9, 1994

BACKGROUND OF THE INVENTION

This invention relates to a display apparatus and display control method used in, say, a CAD (computer aided design) system utilized when designing machines or the like.

In a case where any desired part shape on the display of a CAD system capable of displaying a plurality of parts is desired to be hidden or removed from the display, one method used in the prior art is to designate the part name or group name of the part using a keyboard or mouse. Another method is to directly designate a displayed part on the display screen using a pointing device such as a mouse, thereby hiding the designated part shape.

Conversely, in order to re-display the shape of a part already hidden, the part name or group name is designated by a mouse or keyboard, thereby causing the designated part to be shown again.

In a case where machine design is performed using a CAD system, the design of the arrangement layout of the constituent parts or constituent units of the particular machine is carried out. At such time the designer takes into account the positional relationship of the surrounding parts as well as the positional relationship between units and the shapes of the parts and decides shape and arrangement in such a manner that the parts and units will not interfere with one another.

In layout design for deciding shape and arrangement of a plurality of parts on a trial-and-error basis, the associated parts frequently are displayed or hidden (not displayed). When an instruction for displaying or hiding a figure representing a shape is made in the conventional display apparatus, it is required that the designer be aware of and use the identifiers of part names in order to specify the parts. This means that it is difficult for the designer to specify parts directly. As a consequence, designating whether figures should be displayed or erased in the conventional display apparatus is not easy. In other words, the user interface is not always satisfactory.

SUMMARY OF THE INVENTION

Accordingly, an object of the present invention is to provide a display apparatus and display control method through which members under display control can be specified intuitively.

Another object of the present invention is to provide a display apparatus and display control method through which a specific member is designated from among displayed members and an identifier is displayed instead of the shape of the designated member, thereby making it possible to grasp intuitively the position of a member that has been hidden from view.

Another object of the present invention is to provide a display apparatus and display control method through which a specific member is designated from among displayed members, an identifier is displayed instead of the shape of the designated member and, when display of the shape of a member that has been hidden is to be resumed, the identifier is designated to again show the the shape of this member.

A further object of the present invention is to provide a display apparatus which allows the operator to designate part of the displayed shape of a target member from among a plurality of displayed members, whereby it is possible to temporarily stop displaying the shape of this member.

Yet another object of the present invention is to provide a display apparatus and display control method which, when a member that has already been hidden is to be shown again, allows the operator to readily grasp the position of the hidden member.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 12 is a diagram showing the composition of a management table used in the second embodiment.

DESCRIPTION OF THE PREFERRED EMBODIMENTS

A CAD system to which the display control method of the invention is applied will now be described with reference to the accompanying drawings.

System Configuration

Figure 2:
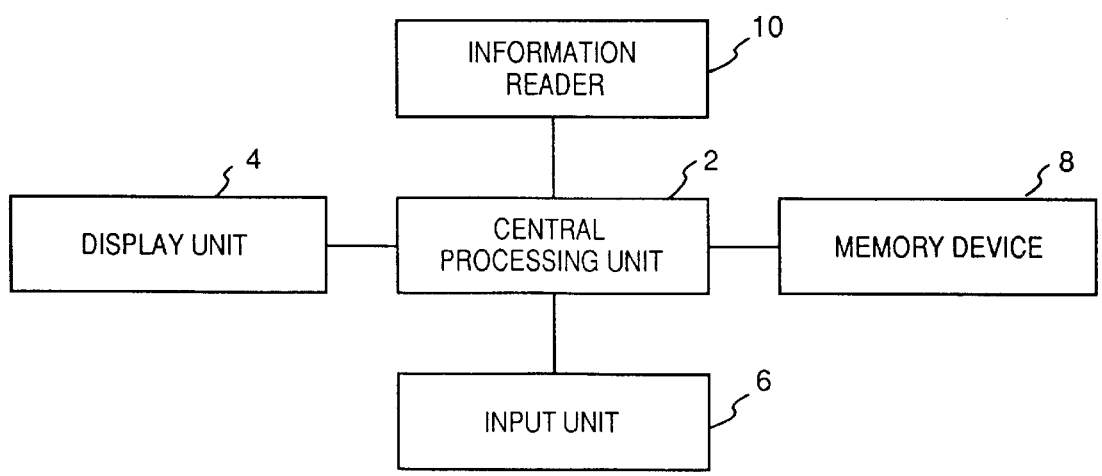
FIG. 2 is a block diagram illustrating the general construction of a CAD apparatus to which the shape display method of the first embodiment is applied.

FIG. 2 is a block diagram illustrating the construction of a CAD system used in first and second embodiments to which the shape method of the present invention is applied.

The CAD system includes a central processing unit 2, a display unit 4, an input unit 6, a memory device 8 and an information reading unit 10. These will now be described in detail.

It is assumed that the CAD system displays the layout of the parts of a certain assembly. The CAD system can of course be applied also to a display of figures for other purposes. Here the figures displayed are referred to as "parts" for descriptive purposes.

The central processing unit 2 executes a plurality of processing operations, described later, in addition to processing for displaying shapes. The display unit 4 displays two- and three-dimensional images corresponding to part shapes, icons which are pictorial characters or the like representing identifiers such as part names, and menus for designating whether parts are to be shown or hidden. The input unit 6, which has a keyboard and a pointing device such as a mouse, is used to enter information necessary for showing or hiding part shapes, to make menu selections and enter various commands. The memory device 8 stores a program for displaying shapes, described below, as well as two- and three-dimensional shape data representing parts. The information reading unit 10 reads in the shape-display program from an external unit and stores the program in the memory device 8.

In this embodiment, a program is read in a semiconductor RAM or in the memory device 8, which uses a magnetic disk or the like, from an external storage medium such as a magnetic tape or floppy disk through the information reading unit 10. Two- or three-dimensional shapes are displayed on the display unit 4, and data representing the two or three-dimensional shapes is stored in the memory device 8. The selection of menus necessary for displaying shapes as well as the selection of parts is performed by the input unit 6. The shape of a designated part or the like is hidden from view and replaced by an icon displayed on the display unit 4. Two- or three-dimensional shapes of hidden parts in the vicinity of parts or positions that have been designated are re-displayed on the display unit 4.

Here, a two-dimensional shape is comprised of two-dimentional graphic elements such as points, straight line segments, circles, arcs, spline curves, hyperbolas, parabolas, and series of straight line segments. The elements are expressed by two components (x, y) in the case of a Cartesian coordinate system. A two-dimensional shape is displayed, hidden, removed, moved and/or copied in a group basis which comprises a set of two-dimensional graphic elements which are related to each other.

A three-dimensional shape is comprised of three-dimensional graphic elements such as points, straight line segments, circles, arcs, spline curves, hyperbolas, parabolas, series of straight line segments, three-dimensional planes, cylindrical surfaces, conical surfaces, spherical surfaces and other curved surfaces expressed parametrically. The elements are expressed by three components (x, y, z) in the case of a Cartesian coordinate system. The three-dimensional figure elements can be displayed and hidden and subjected to such operations as deletion, moving and copying in individual units or as single groups composed of a set of elements having cohesiveness, such as the shape of a part or the like. For descriptive purposes, one group shall be referred to as an "object".

Displaying a three-dimensional shape means regarding one two-dimensional plane defined is based upon point of sight as one projection screen, projecting the three-dimensional shape of interest on the projection screen employing the normal-line direction of this three-dimensional plane as the projection direction, and displaying the result on the display unit 4.

In this embodiment, portions concealed at the time of projection are hidden (not displayed) upon taking the hierarchical relationship into account, and shading (shadowing) can be applied upon referring to light-source information set in advance with regard to the plane as seen from the projection direction.

Further, the display unit 4 displays two-dimensional shapes or three-dimensional shapes, which have been projected upon the projection screen, upon performing enlargement or reduction over a limited range. To this end, the central processing unit 2 clips the shapes displayed on the display unit from the shapes to be displayed and then displays the results on the display unit 4.

The means for setting the above-mentioned projection screen, the means for projecting the three-dimensional shapes on the projection screen, the means for creating shapes to be displayed from what is projected upon the projection screen and from two-dimensional figures, and the means for displaying the created shapes on the display unit 4 are well-known in the art. This embodiment is provided with these means and the expression "display of shapes" mentioned below means that the embodiment is implemented using these means.

FIRST EMBODIMENT

Display by Substituting Icons

Figure 1:
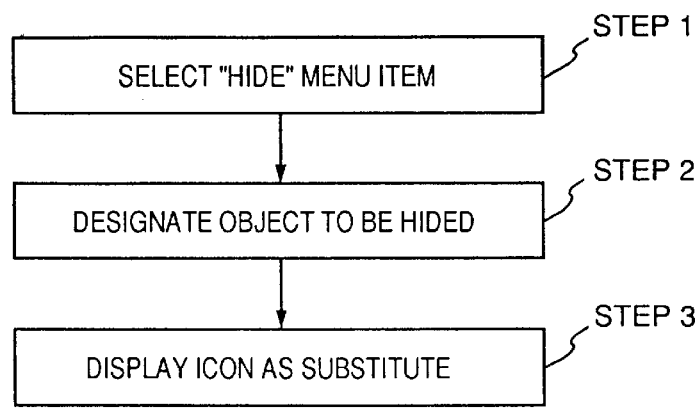
FIG. 1 is a flowchart illustrating an overview of a shape display method according to a first embodiment of the present invention.
Figure 3A:
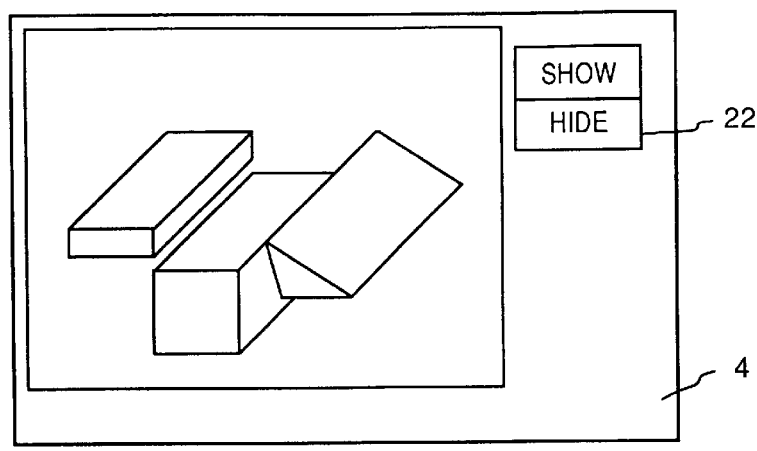
FIGS. 3A through 3C are diagrams for describing the manner in which the progress of the operation of the invention shown in FIG. 1 is displayed on a display unit.
Figure 3B:
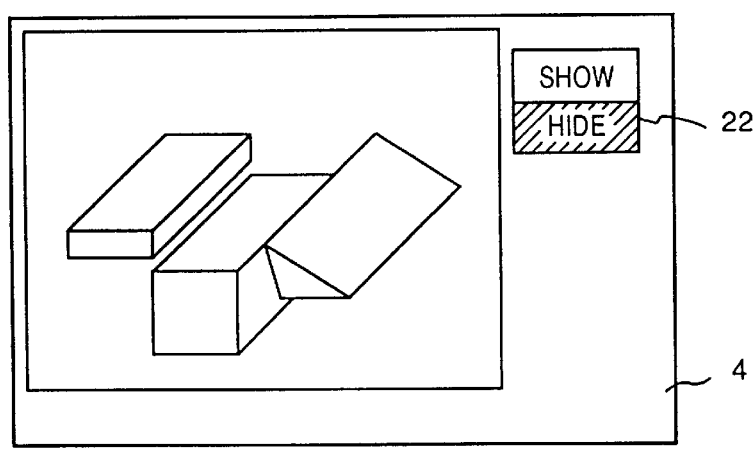
Figure 3C:
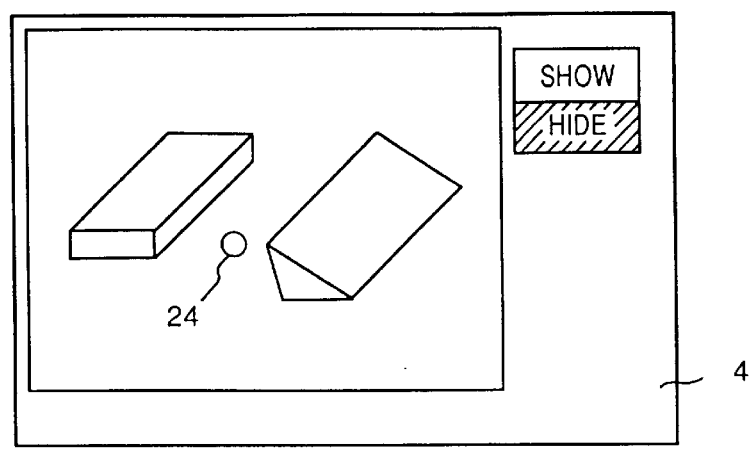

Operation will be displayed using a flowchart indicating the general features of the shape display method of FIG. 1 and the explanatory views of FIGS. 3A~3C showing the course of the operation.

Step 1 in FIG. 1 is for selecting an item "HIDE" from a menu in order not to display the shape of a part or the like. This is accomplished by using a mouse to designate a "HIDE" menu 22 displayed on the display unit 4 in FIG. 3A.

It should be noted that a menu for hiding shapes can be assigned to a specific key on a keyboard or command box in advance. By pressing the key to which the menu is assigned, an operation for "hiding" a shape can be initiated.

In a case where the menu for hiding a shape has been selected, "HIDE" in the menu 22 is highlighted, as shown in FIG. 3B, so that the operator will know that "HIDE" has been selected. Furthermore, at step 2, the central processing unit 2 prompts the operator to designate an "object" (i.e., "part") that is to be hidden from view.

More specifically, at step 2 the operator uses the input unit 6 such as a mouse to specify a part or the like that is to be hidden from among parts displayed on the display unit 4. It is also possible to designate a part to be hidden by entering the identifier of the part name using the input unit 6 such as the keyboard.

When a part to be hidden from view is designated, the central processing unit 2 causes an icon (identifier) or the like to be displayed for the part designated to be hidden at step 3.

More specifically, at step 3, the shape of a part designated to be hidden is erased from the display unit 4 and in its place an icon 24 of the kind shown in FIG. 3C is displayed on the display unit 4.

In this embodiment, means for setting whether the icon 24 is to be shown or hidden is provided in advance. When a designation for not displaying a part or the like has been made in a case where a mode for hiding (not displaying) the icon 24 has been set, the shape of the part or the like designated to be hidden is erased from the display unit 4 and the substitution icon also is not displayed. In this embodiment, the arrangement is such that icons are displayed if no particular designation is made (this represents a default setting).

Thus, according to this embodiment, the icon 24 such as a pictorial character is displayed in place of a shape that has been hidden from view. In a case where layout processing is performed, therefore, the operator is capable of readily ascertaining that a part has been hidden. As a result, layout processing is made more efficient and reliable.

A part name or the like may be displayed instead of an icon.

Furthermore, by executing step 2 again immediately after step 3, part shapes desired to be hidden one after another can be designated and then hidden from view.

Figure 4A:
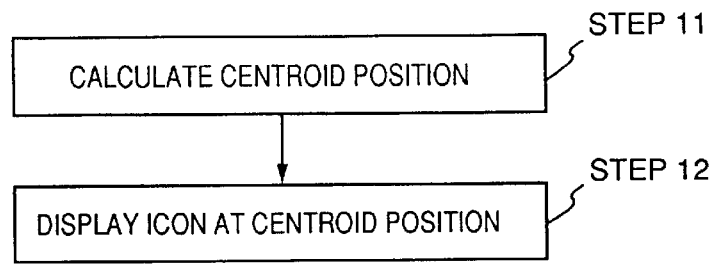
FIG. 4A is a flowchart for describing the details of a step 3 shown in FIG. 1.

A flowchart illustrated in FIG. 4A is for describing the details of a method of setting the display position of an icon in a case where a part designated to be hidden at step 3 is displayed in the form of an icon.

At step 11 in FIG. 4A, the centroid of the shape of a part designated to be hidden is calculated by the central processing unit 2, which refers to shape data stored in the memory device 8. As will be described later, an icon serving as an identifier is displayed at the position of the centroid. The reason for displaying the icon at the position of the centroid is that the centroid position is visually the most natural position for displaying the icon as far as the operator is concerned.

The centroid position serving as the position at which the icon is displayed need not be calculated with an especially high degree of accuracy. The centroid position is calculated approximately by the method described below.

Figure 4B:
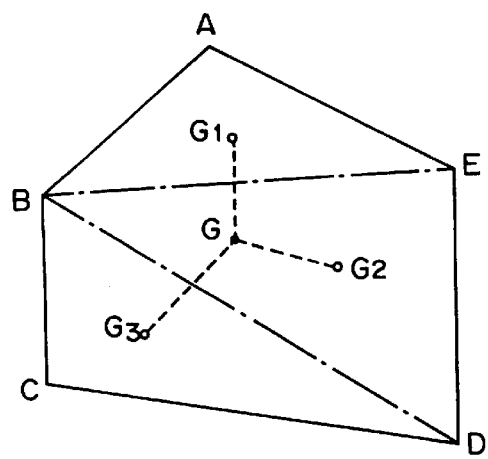
FIGS. 4B and 4C are diagrams for describing the principle of centroid calculation.
Figure 4C:
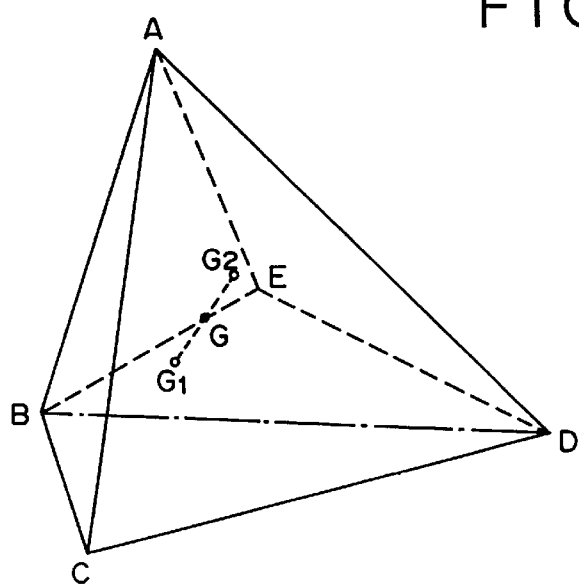

A case in which the display unit 4 displays a two-dimensional shape will described with reference to FIG. 4B. If, in a case where the centroid position of a two-dimensional shape is calculated, the outer peripheral line of this shape is a closed loop, the outer peripheral line is approximated by a polygon (triangles ABE, BDE and BCD in FIG. 4B) and the centroid of this polygon is found. The method of determining the centroid of a polygon is well known. For example, any vertex of the polygon is adopted as a datum point, this polygon is divided into a plurality of triangles composed of the datum point and the starting and end points of each side of the polygon, and the centroid (G) of the overall polygon is obtained from the centroids ($G_i$) of these triangles. This is expressed as follows:

$$G = \frac{\sum_i (s_i \cdot G_i)}{\sum_i s_i} \qquad (1)$$

where G and $G_i$ represent two-dimensional vectors and $s_i$ represents the area of each triangle. The subscript i indicates each triangle.

In a case where the outer peripheral loop of a target shape is not a closed loop, the mid-point ($P_i$) of each element constructing the shape is found and the centroid (G) is obtained as follows from the length ($d_i$) of each of these elements:

$$G = \frac{\sum_i (d_i \cdot P_i)}{\sum_i d_i} \qquad (2)$$

where G and $P_i$ represent two-dimensional vectors and the subscript i represents the element.

In a case where the centroid position of a three-dimensional shape is calculated, the three-dimensional shape is approximated by a polyhedron (a tetrahedron ABED and a tetrahedron ABCD) and the centroid of the polyhedron is found. The centroid of a polyhedron is found through the following procedure:

First, one appropriate vertex of the polyhedron is selected as a datum point. Next, the polyhedron is divided into a plurality of tetrahedrons which contain this datum point. The centroid ($G_i$) and volume ($v_i$) of each tetrahedron are obtained and the overall centroid (G) is obtained as follows:

$$G = \frac{\sum_i (v_i \cdot G_i)}{\sum_i v_i} \qquad (3)$$

where G and $G_i$ represent three-dimensional vectors and $v_i$ the volume of each tetrahedron. The subscript i represents each tetrahedron.

At step 12, the icon 24 is displayed as shown in FIG. 3C in the vicinity of a position on the display unit 4 corresponding to the centroid position calculated at step 11.

By thus displaying the icon 24 near the centroid of part to be hidden from view, with the icon serving as substitute for the image of the part, the operator can readily grasp approximately where the hidden part is located.

Resuming Display of Shapes . . . Example 1

Substituting the display of an icon for the display of a part is convenient when the part is to be designated to restore the display thereof when such restoration is desired. If there are at least two parts hidden from view, it is difficult with the prior-art technique to designate one of the parts when only display of this part is desired to be restored, the reason being that the shapes of these parts cannot be seen. With this embodiment, however, the icons of the parts are displayed, thereby making it easy to designate the desired part.

Figure 5:
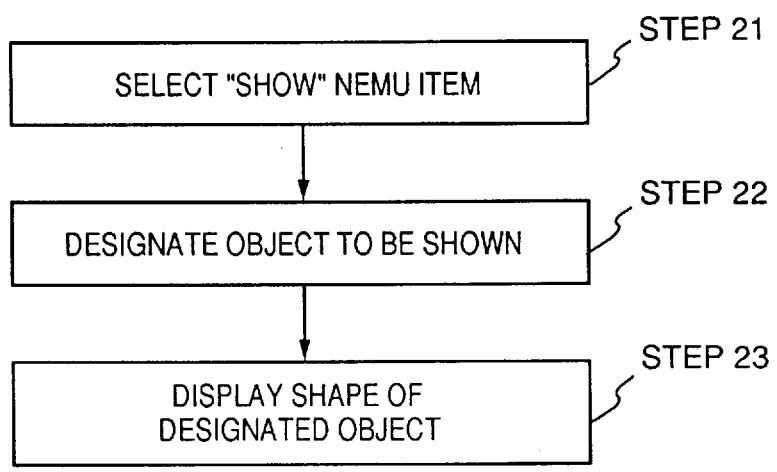
FIG. 5 is a flowchart for describing the details of a method of displaying the shape of a hidden part or the like, in which state an icon is being displayed in the vicinity of a centroid.

The flowchart of FIG. 5 illustrates a control procedure for resuming display of the shape of a part in a case where an icon is being displayed instead of the shape of the part.

Figure 6A:
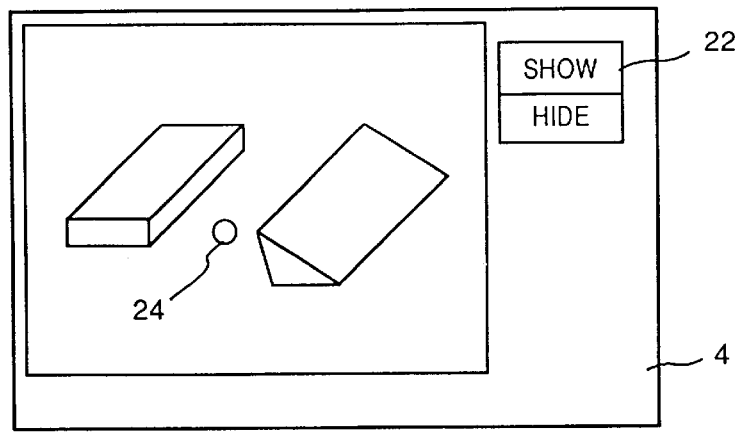
FIGS. 6A through 6C are diagrams for describing the manner in which the progress of the operation indicated by the flowchart of FIG. 5 is displayed on a display unit.
Figure 6B:
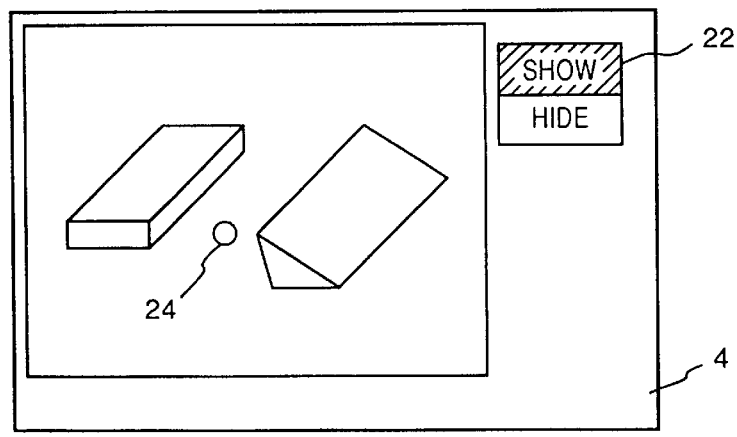
Figure 6C:
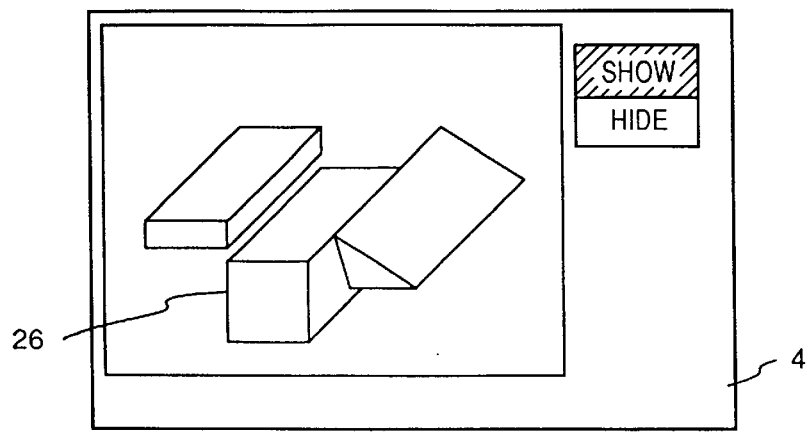

At step 21 in FIG. 5, a "SHOW" item in the menu 22 being displayed on the display unit 4 is designated via the input unit 6, as shown in FIG. 6A. FIGS. 6A through 6C are for describing the manner in which the progress of the operations shown in the flowchart of FIG. 5 is displayed on the display unit 4. It should be noted that a menu for instructing to display shapes can be assigned to a specific key on a keyboard or command box in advance. By pressing the key to which the menu is assigned, a menu for showing a shape can be selected.

In a case where "SHOW" for displaying a shape has been selected in the menu 22, "SHOW" in the menu 22 on the display unit 4 is highlighted, as shown in FIG. 6B, so that the operator will know that "SHOW" has been selected. If the menu for showing shapes has been selected, then, at step 22, the central processing unit 2 prompts the operator to select the icon 24 corresponding to the part which the operator desires to show again.

Next, at step 22, the operator uses the input unit 6 such as the mouse to designate the icon 24 being displayed on the display unit 4. Though only one icon 24 is being displayed in FIGS. 6A and 6B, icons are displayed in conformity with the number of parts hidden from view. In this embodiment, identifiers such as part names of parts desired to be displayed can also be designated by the input unit 6 such as the keyboard or mouse. If an icon corresponding to a part shape desired to be shown is selected, the central processing unit 2 executes display of the shape of the part corresponding to the icon 24 selected at step 23.

At step 23, the shape of a designated part or the like is caused to be displayed on the display unit 4, as indicated at 26 in FIG. 6C. The icon 24 vanishes from the display unit 4 at this time.

In this embodiment, executing step 22 again immediately after step 23 makes it possible to successively designate icons 24 corresponding to part shapes desired to be shown and to show the shapes one after another.

In this embodiment as described above, the shape of a part that has been hidden from view can be shown by designating a displayed icon. This makes it possible for the operator to operate the apparatus intuitively without being aware of identifiers such as part names.

Resuming Display of Shapes . . . Example 2

By adopting the method described below, a hidden part can be displayed again by an intuitive operation even in a case where an icon serving as an identifier is not being displayed.

Figure 7A:
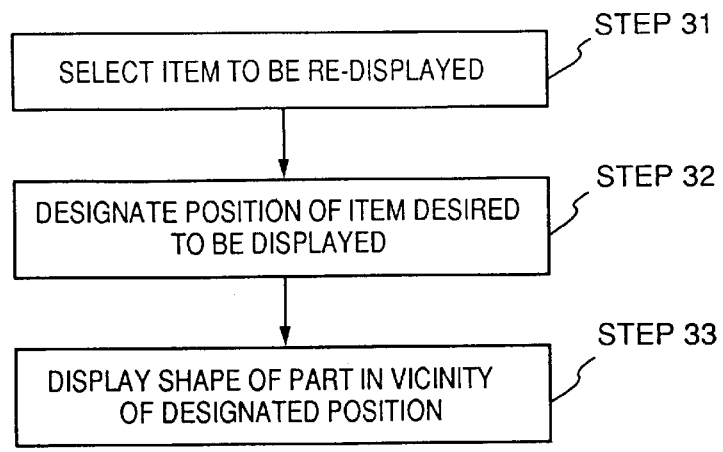
FIG. 7A is a flowchart for describing the details of a method of displaying the shape of hidden part or the like in a case where an icon corresponding to the shape of the hidden part or the like is not being displayed.

The flowchart shown in FIG. 7A illustrates this control procedure.

Figure 8A:
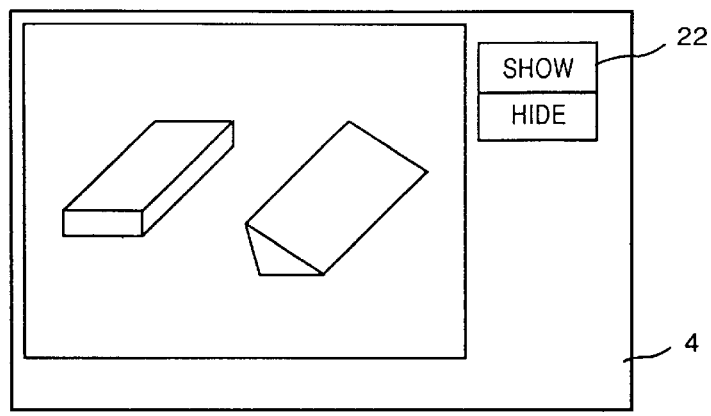
FIGS. 8A through 8C are diagrams for describing the manner in which the progress of the operation indicated by the flowchart of FIG. 7 is displayed on a display unit.
Figure 8B:
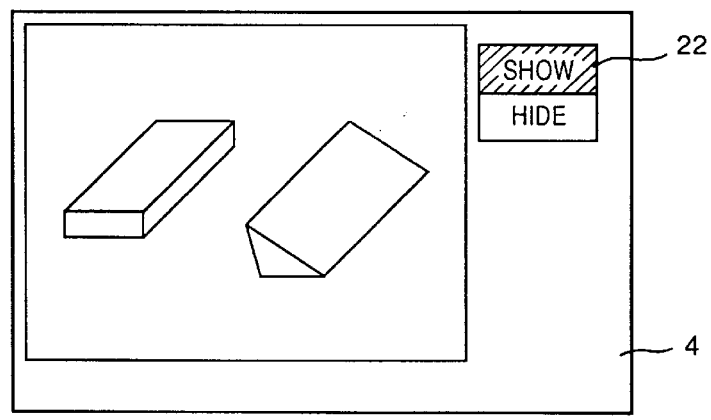
Figure 8C:
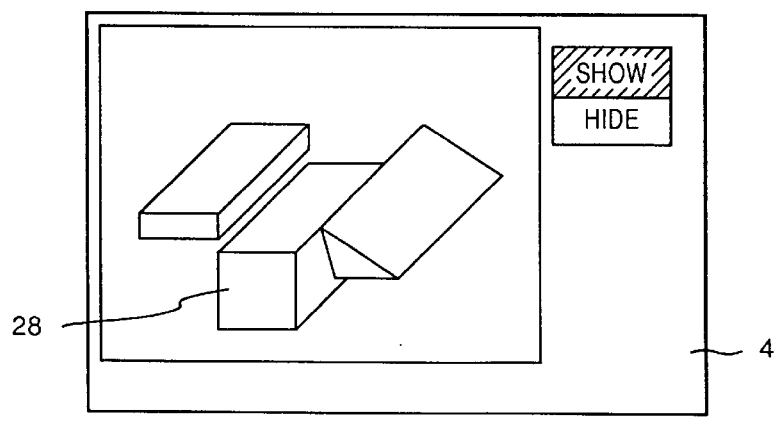

At step 31 in FIG. 7A, a "SHOW" item in the menu 22 being displayed on the display unit 4 in FIG. 8A is designated by the operator via the input unit 6. FIGS. 8A through 8C are for describing the manner in which the progress of the operations shown in the flowchart of FIG. 7A is displayed on the display unit 4. It should be noted that a menu for instructing to display shapes can be assigned to a specific key on a keyboard or command box in advance. By pressing the key to which the menu is assigned, a menu for showing a shape can be selected.

In a case where the "SHOW" menu for showing a shape has been selected, "SHOW" in the menu 22 on display unit 4 is highlighted, as shown in FIG. 8B, so that the operator will know that "SHOW" has been selected. If "SHOW" has been selected, then, at step 32, the central processing unit 2 prompts the operator to designate the position of the part which the operation desired to display.

More specifically, step 32 calls for the operator to use the input unit 6 such as the mouse to designate the proximity of a position at which the operator believes the shape of the hidden part desired to be displayed will appear. When this position is designated, the relevant information is stored in the memory device 8 and, at step 33, the central processing unit 2 causes the hidden part to be displayed in the vicinity of the position designated.

That is, at step 33, the central processing unit 2 searches for a part in the vicinity of the position designated and finds a part, which is not currently being displayed, at a position closest to the designated position. The shape of the part thus found is caused to be displayed on the display unit 4, as indicated at 28 in FIG. 8C. When the above-mentioned search is being performed, reference is made to shape data and the like stored in the memory device 8.

A method of searching for the shape of a hidden part in the vicinity of a designated position will now be described.

In this embodiment, means for setting the range of the search are provided. These means set the limits of the search in advance and store them in the memory device 8. If no particular search range is set, predetermined default values are adopted as the search limits.

Figure 7B:
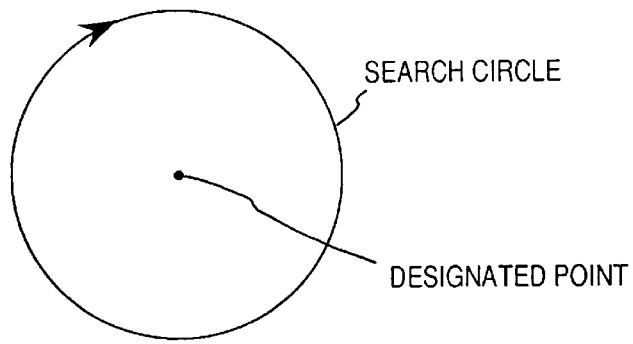
FIG. 7B is a diagram for describing the principle of a technique for search for a hidden part using a circle.

A case in which a figure is a two-dimensional shape will be described on the basis of FIG. 7B. In the case of a two-dimensional figure, a search circle is set. The center of the circle is a designated position (this position is obtained at step 32), and the radius of the circle is the set search range. While referring to the shape and other data stored in the memory device 8, the central processing unit 2 judges whether there is a part intersected or surrounded by the search circle. If the result of the search is that there is a hidden part intersected or surrounded by the search circle, it is decided that the part is one to be re-displayed. If a plurality of hidden parts are intersected or surrounded by the search circle, then all of these shapes are caused to be displayed on the display unit 4.

Figure 7C:
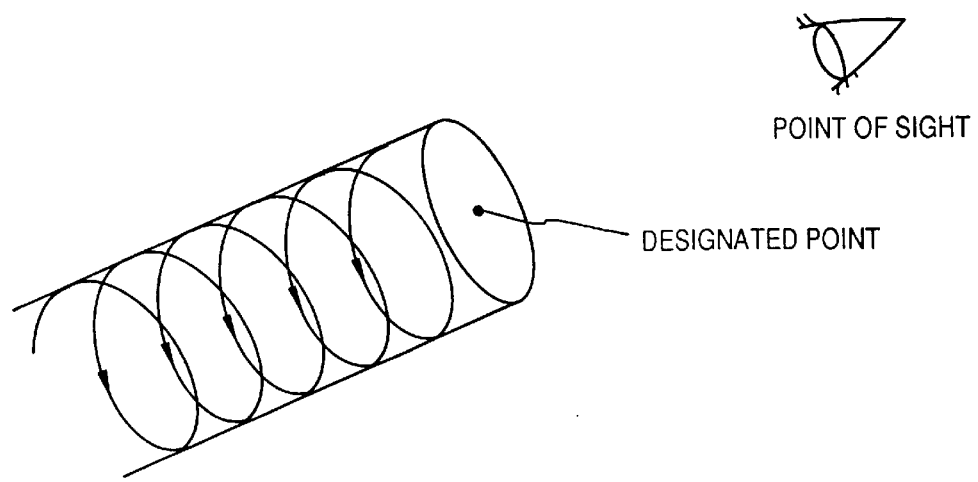
FIG. 7C is a diagram for describing the principle of a technique for search for a hidden part using a cylinder.

In the case of a three-dimensional shape, a search cylinder is set. As shown in FIG. 7C, the central axis of the cylinder is an axis extending in the projection direction from a designated position, and the radius of the cylinder is the set search range. While referring to the shape data and other data stored in the memory device 8, the central processing unit 2 judges whether there is a part intersected or surrounded by the search cylinder. If the result of the search is that there is a hidden part intersected or surrounded by the search cylinder, it is decided that the part is one to be re-displayed on the display unit 4. Theoretically, the search cylinder is one having an infinite length. If a plurality of hidden parts are intersected or surrounded by the search cylinder, then all of them are caused to be displayed on the display unit 4.

In this embodiment, executing step 32 again immediately after step 33 makes it possible to successively designate the positions of shapes of parts desired to be shown and to show the shapes one after another.

In accordance with the foregoing method, a part that has been hidden from view can be displayed by an intuitive operation even if an icon corresponding to the shape of this hidden part is not being displayed.

SECOND EMBODIMENT

A second embodiment to which the display control method of the invention is applied will now be described. The second embodiment, which is premised on use of a pointing device such as a mouse, is characterized by the ease with which the "object" (namely the shape of a part) designated by the mouse is designated. However, the functions established to achieve this are essentially the same as those of the first embodiment.

Menu

Figure 9A:
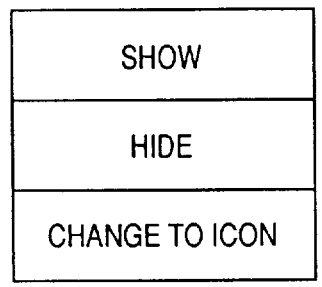
FIG. 9A is a diagram showing a menu screen used in a second embodiment of the invention.

FIG. 9A illustrates a menu set in the second embodiment. In the menu of FIG. 9A, a "SHOW" item is designated to display an object; a "HIDE" item is designated to inhibit display of an item (and to hide the identifier as well); and a "CHANGE" item is designated to change the display of an object to the display of an icon representing the object. More specifically, the "HIDE" menu of the first embodiment corresponds to the "HIDE" and "CHANGE" menus of the second embodiment.

Software Composition

Figure 9B:
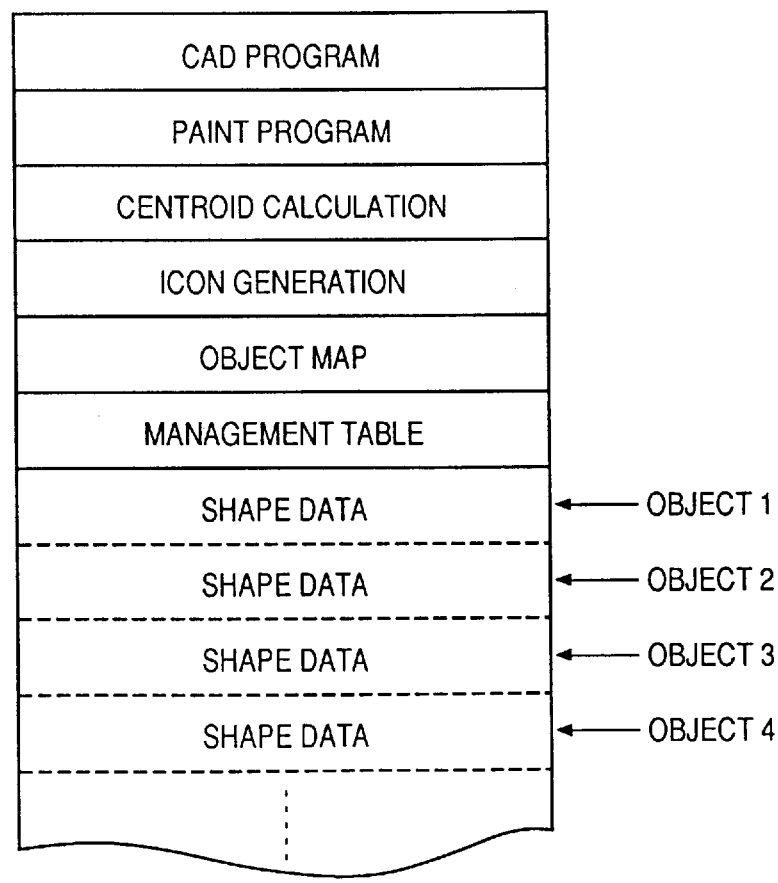
FIG. 9B is a diagram showing the second embodiment in terms of software.

The hardware of the second embodiment is essentially the same as that of the first embodiment (FIG. 2). The composition of the software programs used in the second embodiment is shown in FIG. 9B. These programs are provided in the memory device 8.

Object Map

The second embodiment is so adapted that the particular object located at a position designated by the operator using a mouse is detected by a map referred to as an "object map". The map is provided in a prescribed area (FIG. 9B) of the memory device 8 of FIG. 2 and is capable of being accessed by the processing unit 2.

Figure 10:
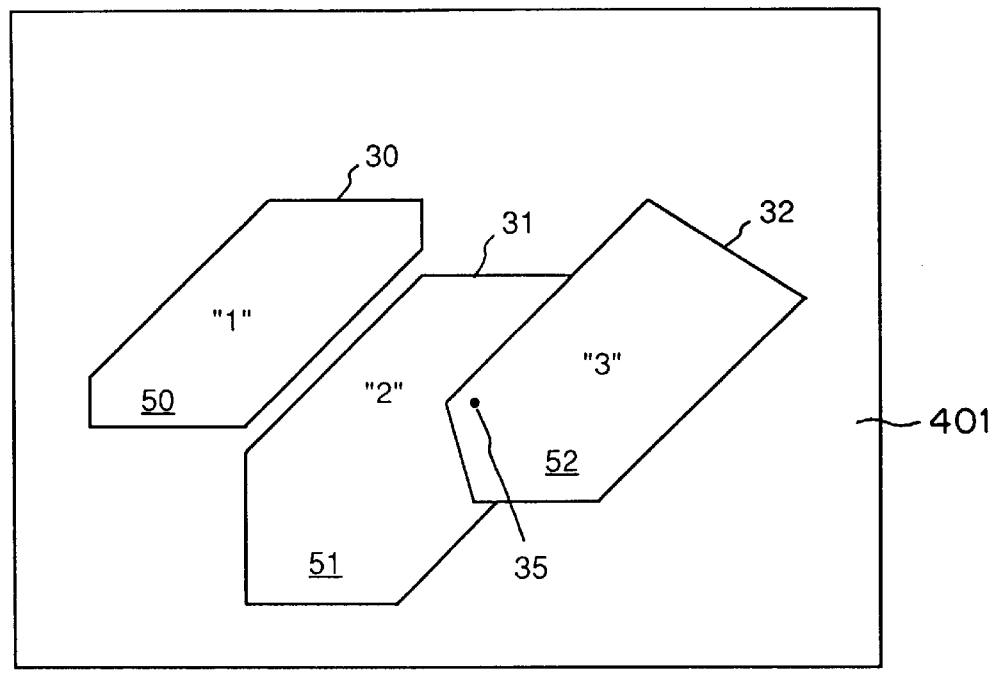
FIGS. 10 and 11 are diagrams illustrating a change in maps used in the second embodiment.

FIG. 10 illustrates an example of the map. The map 401 has a space whose size is the same as that of the display screen of display unit 4 and a depth such that all identifiers of objects to be displayed can be specified. According to the second embodiment, "objects" comprising a set of figures constructing the shape of one part are assigned unique identification numbers in the order in which the objects are registered in the CAD program (FIG. 9B). For example, in order for the CAD program to be capable of registering a maximum of 1000 objects and painting these on the display screen, identification numbers having a maximum of 1000 values are assigned. In order to express 1000 values, ten bits ($2^{10}$=1024) will suffice. Accordingly, the "depth" of the object map 401 is ten bits.

If three objects of the kind shown in FIG. 3A are being painted by the CAD program, the projections of the individual objects become three closed areas 50, 51, 52, as illustrated in FIG. 20. The object 30 does not overlap the other objects but a part of the object 31 is concealed by a part of the object 32. A method of creating such a projection diagram is well known. If the object 30 is registered first, then the object 31 and finally the object 32, then identification numbers ("object IDs") "1", "2" and "3" are assigned to these objects in the order mentioned. Data "1" is written at all addresses corresponding to the area 50 in the object map, data "2" is written at all addresses corresponding to the area 51, and data "3" is written at all addresses corresponding to area 52.

Position 35 in FIG. 10 is a position at which the object 31 and object 32 overlap each other. When the address of position 35 of the object map is read out, this address is "1" and therefore it is determined that 35 falls within the projection of the object of object ID=3.

Figure 11:
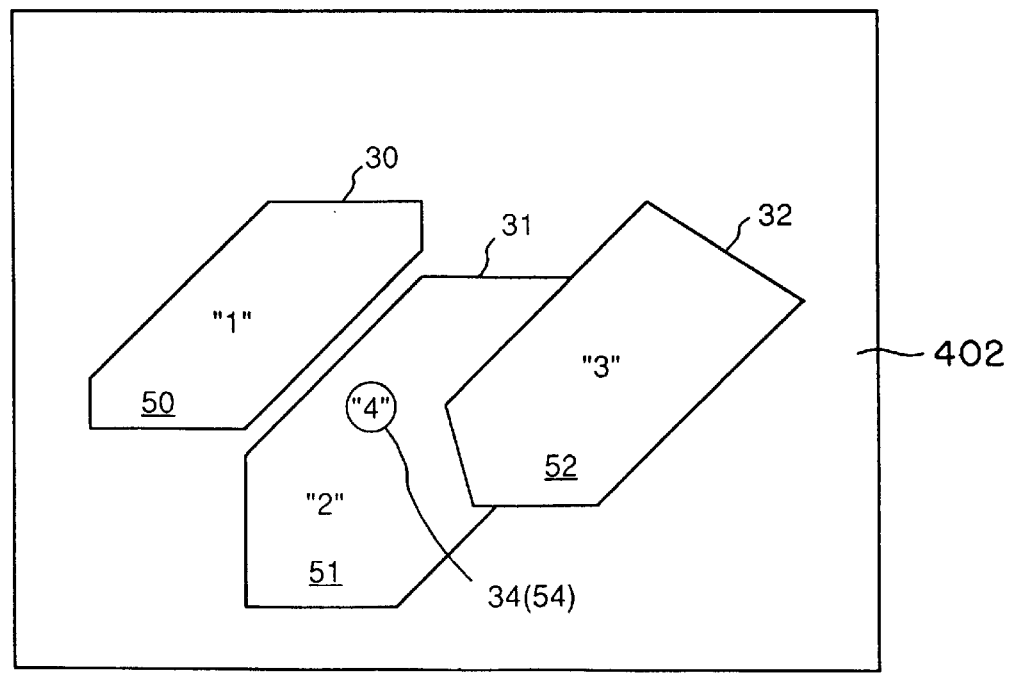

FIG. 11 illustrates an object map 402 representing the state of the display shown in FIG. 3C. Here the object 31 is displayed instead of the icon 24 corresponding to object 31. In other words, according to the second embodiment, an icon also is understood as being one of the objects and therefore the object ID=4 is given for the icon 24 as well.

FIG. 12 illustrates a table for managing the painting of objects. This table also is provided in a prescribed area (FIG. 9B) of the memory device shown in FIG. 2 and is capable of being accessed by the processing unit 2. The management table is provided with an entry for each object ID. In the example of FIG. 12, four entries are established for respective ones of the four objects shown in FIG. 11.

Further, a flag D(i) (display/hide flag) in the management table indicates whether or not an object i is actually displayed. According to the example of FIG. 12 corresponding to FIG. 11, D of object ID=2 is 0 [D(2) =0] and therefore object 2 is not painted.

A field GDP(i) stores a pointer which points to figure data of object i. The figure data is stored in a vector format. The vector data is composed of two-dimensional points, two-dimensional line segments, two-dimensional circles, two-dimensional circular arcs, two-dimensional spline curves, two-dimensional hyperbolas, two-dimensional parabolas, two-dimensional line-segment sequences, three-dimensional points, three-dimensional line segments, three-dimensional circles, three-dimensional circular arcs, three-dimensional spline curves, three-dimensional hyperbolas, three-dimensional parabolas and three-dimensional line-segment sequences. In the example of FIG. 12, shape data of object ID=2 is stored at address "bbb". In actuality, the processing unit 2 paints the object based upon the vector data at this pointer in accordance with the paint program.

A flag IDF(i) indicates whether shape data of an icon corresponding to an object i has already been generated. If an object for which shape data of an icon has not been created is replaced by display of an icon (i.e., if the menu item "CHANGE" has been designated), a icon generation program (see FIG. 9B) of the processing unit 2 reduces the image data of the object i, whereby the shape data of the icon is generated in the form of a bitmap. An icon can also be created by the operator.

The storage location of the shape data of an icon created or already registered is stored at the pointer IDP(i). In the example of FIG. 12, it will be understood that shape data of the icons of objects whose object IDs are 1, 2 and 3 have been stored at addresses "ddd", "eee" and "fff", respectively.

WP(i) stores the position of the centroid of object i. The method of deciding the centroid position is the same as described in the first embodiment. In the example of FIG. 12, it will be understood that the centroids of objects whose object IDs are 1, 2 and 3 are calculated as $AD_1$, $AD_2$ and $AD_3$, respectively. Centroid position is represented by the relative position of the object with respect to a prescribed datum point. The datum point is represented by absolute position in the display space of the display unit 4. In the design process, editing frequently is performed by moving or rotating an object. If the shape of the object is not altered, the centroid position will not move in relative terms even if the object is moved or rotated. Once centroid position has been calculated, unnecessary repetitive calculation of centroid position is prevented by setting the corresponding flag WPF.

The flag IF(i) indicates whether the object is an ordinary object or an icon object.

In the example of FIG. 12, the object of object ID=3 is an ordinary object and not an icon [IF(3)=0] and is painted by shape data designated by "ddd". This shape is painted with the centroid position [WP(3)=$AD_3$] serving as the center. This object is currently being displayed on the display unit [D(3)=1].

The field CID(i) of the table in FIG. 12 is used only for icon objects and stores the object IDs corresponding to these icons. Further, the display position of an icon is the centroid position of the corresponding object, as mentioned above. Accordingly, in the example of FIG. 12, the object whose object ID is 4 is an icon corresponding to the object whose object ID is 2[IF(4)=0, CID=2]. This object is painted at a centroid position ($AD_2$), which is the same as that of the object whose object ID is 2, by shape data designated by the pointer "eee". This object is currently being displayed on the display unit [D(4)=1].

Control Procedure

Figure 13:
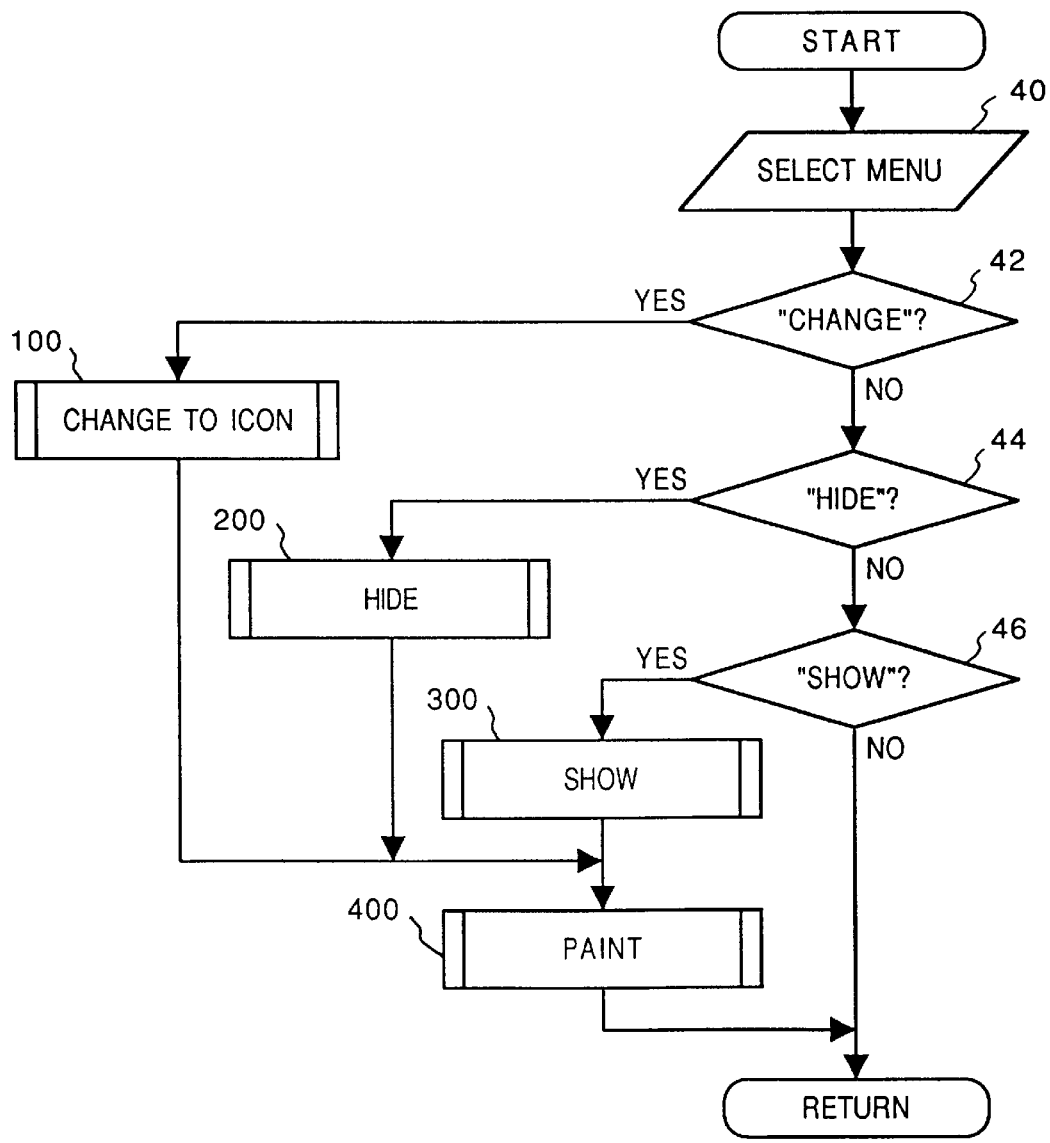
FIGS. 13 through 16 are flowcharts illustrating a control procedure according to the second embodiment.

FIG. 13 is a flowchart illustrating the main routine of the control procedure according to the second embodiment.

Figure 15:
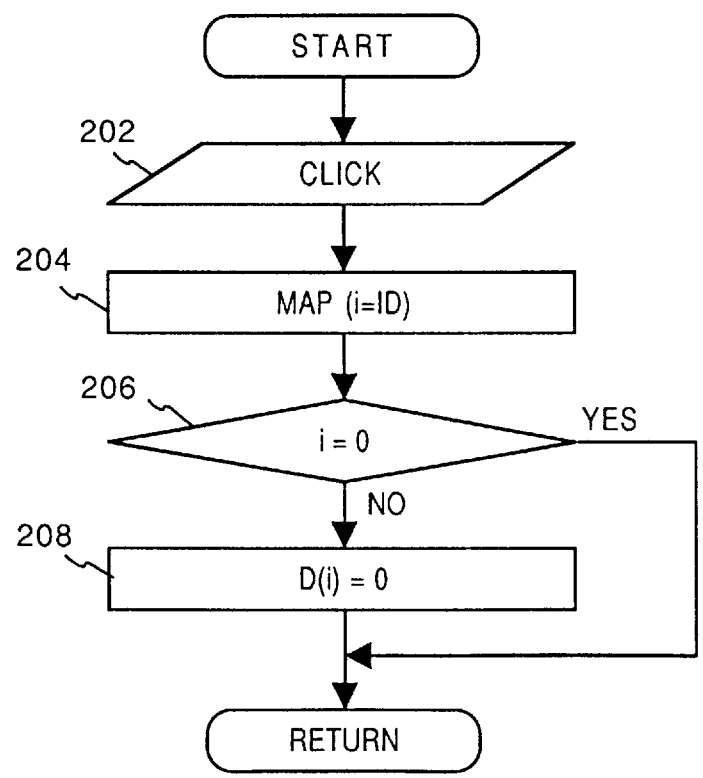
Figure 16:
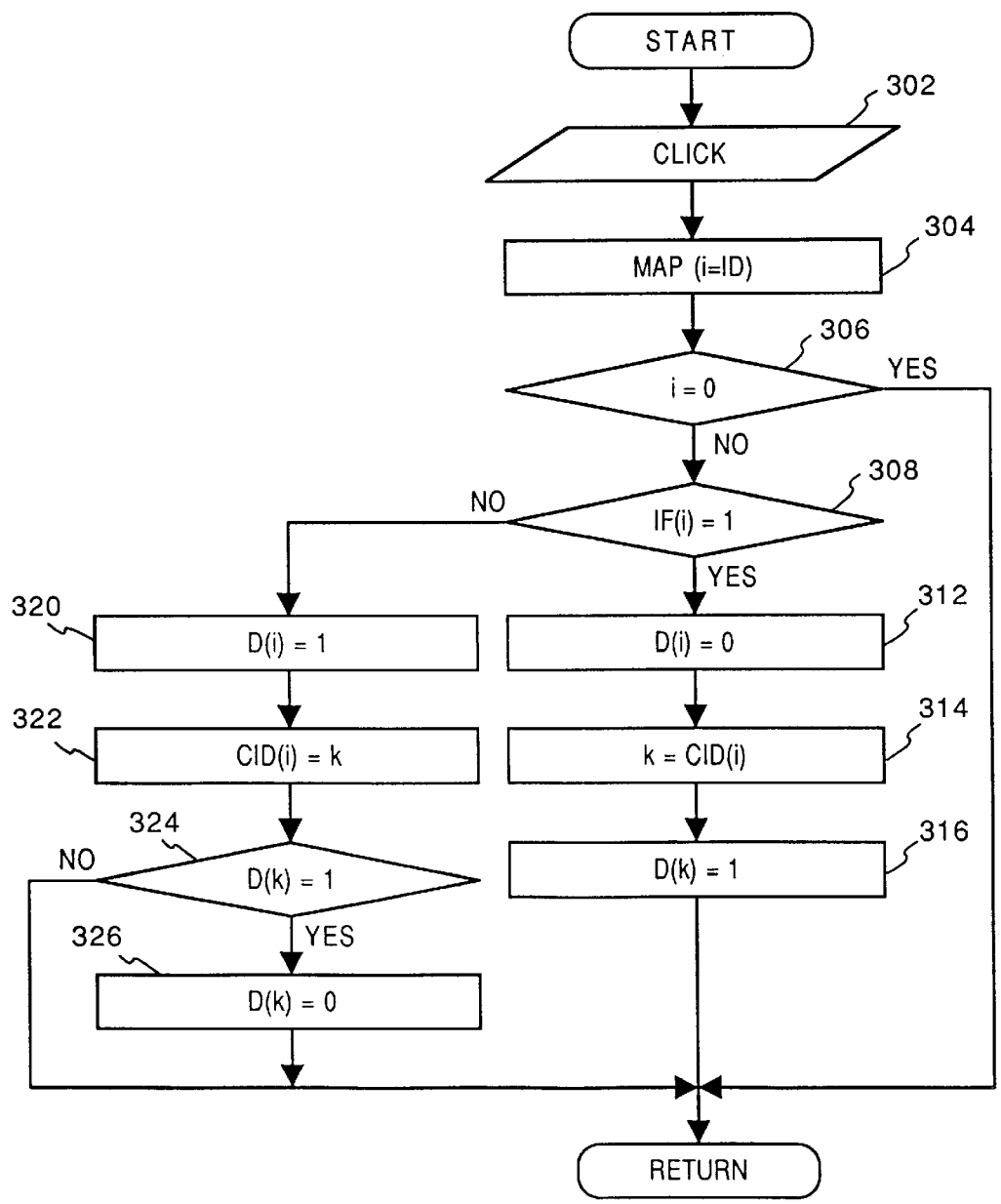

When a menu item is selected, the program proceeds to step 100, 200 or 300, the details of which will be described below with reference to FIGS. 14, 15 and 16, respectively, depending upon the selection made. Specifically, the program proceeds to step 100 if the "CHANGE" menu item is selected, to step 200 if the "HIDE" menu item is selected and to step 300 if the "SHOW" menu item is selected. The control procedure of step 100, 200 or 300 essentially alters the table of FIG. 12 in conformity with the designation made with regard to the respective menu.

A control procedure will now be described for a case in which the "CHANGE" menu item has been selected and an icon displayed in place of the shape display of the object. By way of example, assume that objects of the kind shown in FIG. 3A are being displayed on the display unit 4 and that a map of the kind depicted in FIG. 10 has been formed. In addition, assume that the operator clicks the object 31 to change this object to an icon.

Figure 14:
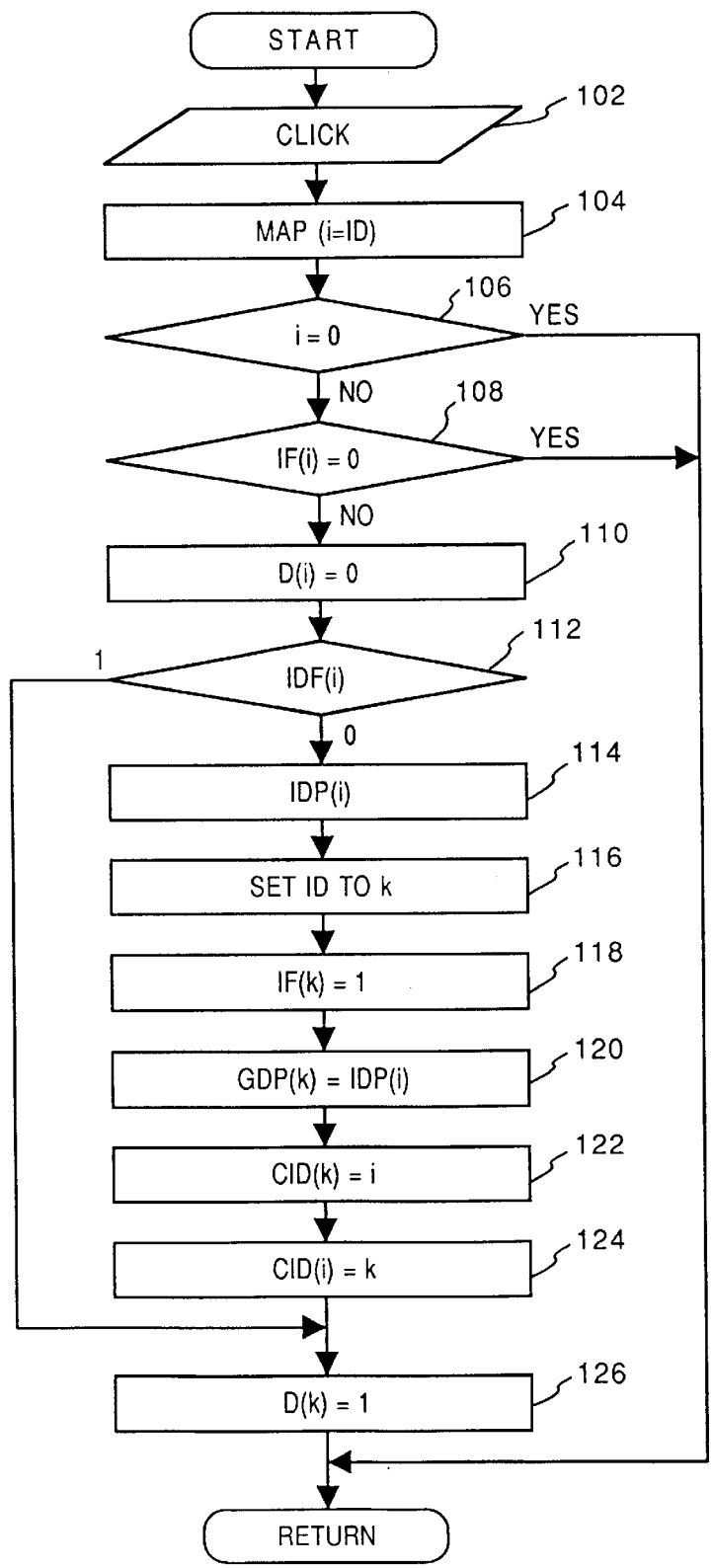

At step 102 in FIG. 14, the position clicked by the operator using the mouse is detected. This position is clicked by the operator using the mouse for the purpose of selecting the object whose display is to be changed over to that of an icon. If the address is (x,y), then the ID of the object map of the (x,y) address is read out. The object indicated by the value of the read map is the object for which the change to the icon is to be made. Accordingly, this ID is stored in a register i at step 104.

Next, it is determined at step 106 whether the value in register i is 0 or not. When the answer is "YES", this means that the operator has used the mouse to click an area other than that occupied by the object. Processing returns to the main routine as a result.

If a "NO" decision is rendered at step 106, this means that the operator has designated an ordinary object or an icon object. In such case it is determined at step 108 whether the object is an icon or not. When it is determined that the designated object is an icon [i.e., when IF(i)=1 holds], this cannot be changed to an icon and therefore processing returns to the main routine.

The case in which the designated object is determined to be an ordinary object at step 108 [i.e., IF(i)=0] will now be described. In this case, the program proceeds to step 110. Here, in order to indicate that the object should be excluded from display, the corresponding flag D(i) is made 0. Next, the value of the flag IDF(i) is investigated at step 112 in order to determine whether an icon has already been set for the object.

If an icon has not been set, then processing proceeds to step 114, where an object (bitmap) of an icon is created from the shape data of object i (i.e., object 31 in FIG. 10). More specifically, if i=2 holds, a figure in a bitmap format is created based upon shape data at GDP(2)=bbb and the figure is then registered at the address "eee". Next, at step 116, an object ID for this icon is set. If "k" represents this object ID, the operation IF(k)=1 is performed at step 118 in order to indicate that this object is an icon. This is followed by step 120, at which the operation GDP(k)=IDP(i) is performed in order to indicate that the shape data of the icon created at step 114 should be displayed for the icon object "k". The operation CID(k)=i is performed at step 122 in order to indicate that this icon is the icon of an object whose object ID is "i". The operation CID(i)=k is performed at step 124 in order to indicate that the icon of object k has been set for object i. Furthermore, the operation D(k)=1 is performed at step 126 in order to indicate that this icon is to be displayed.

In a case where it is found at step 112 that an icon has already been set (IDF=1), it is unnecessary to create icon shape data and therefore processing proceeds to step 126 where the operation D(k)=1 is performed to indicate that this icon should be displayed.

Thus, in a case where objects of the kind shown in FIG. 3A (or FIG. 10) are displayed, only the object 31 in FIG. 10 is designated and replaced by an icon displayed as shown in FIG. 11, the object management table is updated so as to have the values shown in FIG. 12.

When step 122 of FIG. 14 ends, the program returns to step 400 in FIG. 13. At this step the processing unit 2 causes the image to be painted while referring to the management table of FIG. 12. In painting the image, the display unit 2 paints all objects for which the flag D is 1 on the basis of the vector data that has been stored at pointer GDP(i). For example, when a designation is made to the effect that the object 31 in FIG. 10 is to be changed to an icon, D(2)=0 holds and therefore the shape of object 31 is not displayed. Further, the icon of object 31 for which the object ID is 4 has its shape data generated based upon GDP (4) and is displayed in the vicinity of the centroid position WP(4)=$AD_2$.

Thus, a display of the kind shown in FIG. 3C is obtained and the object 31 is replaced by the icon.

It should be noted that the projection map takes on the form shown in FIG. 11 in a case where the display of the shape of object 31 is turned off and the icon is displayed instead. That is, in FIG. 11 an area 54 (object 34) having the value "4" is generated in the area 51 (object 31) having the value "2".

A case in which the menu item "HIDE" has been designated will now be described. In this case, step 202 of FIG. 15 is executed following step 200. At step 202 the operator is prompted to designate an object whose display is to be turned off. This operation delivers the object ID to the processing unit 2, which stores the object ID in the register i (step 204). Whether the operator has designated an object is checked at step 206. The corresponding flag D(i) is turned off at step 208, whereupon the designated object is not displayed by the paint routine of step 400.

Data representing the projection of the object 31 not displayed and data representing the projection of the icon 34 are stored in the projection map besides the projections of the displayed objects 30 and 32, as shown in FIG. 11. If the icon 34 has been designated, the flag D(4) corresponding to the icon 34 is made 0 and the icon vanishes.

A case in which the "SHOW" menu item has been designated will now be described. In this case, step 302 of FIG. 16 is executed following step 300. At step 302 the operator is prompted to designate an object whose display is to be resumed. This operation delivers the object ID to the processing unit 2 (step 204). The ID is stored in the register i (step 304).

When the operator designates the "SHOW" menu item, an ordinary object and icon are merely being displayed.

Whether the operator has designated an object is checked at step 306. It is then determined at step 308 whether the designated object i is an icon or not.

If the designated object i is an icon, the corresponding flag D(i) is made 0 at step 312 in order to erase the display of the icon i. At steps 314 and 316 the flag D corresponding to the object number pointed out by the register CID(i) is made 1, thereby resuming the display of the object corresponding to the designated icon.

In a case where an object that is not an icon has been designated at step 308, the flag D(i) corresponding to this object is made 1 at step 320 to attempt to resume the display of the object i. Steps 322~326 perform control in such a manner that an object and the icon corresponding to this object will not be displayed simultaneously. The object ID of the corresponding icon is searched for at step 322 [k=CID (i)]. If this icon is being displayed [D(k)=1], then the operation D(k)=0 is performed at step 326 in order to erase this display.

Thus, when an icon has been designated, display of the original object is resumed. When an object that is not an icon has been designated, display of this object is resumed and the corresponding icon is erased.

As many apparently widely different embodiments of the present invention can be made without departing from the spirit and scope thereof, it is to be understood that the invention is not limited to the specific embodiments thereof except as defined in the appended claims.

What is claimed is:

1. A display apparatus used in a CAD system for designing a work of a plurality of members, comprising:

display means for simultaneously displaying figures representing two and/or three dimensional shapes of respective ones of the plurality of members, said figures being displayed as elements of the work to be designed;

first designating means for designating a specific member among the plurality of members; and control means, in response to said first designating means, for controlling the display means to display an identifier which visually identifies the member designated by said first designating means within an area in which a shape of the designated member in said display means is displayed, in place of the shape of the designated member, said identifier being displayed in the vicinity of a centroid position of the displayed shape of the designated member.

2. The apparatus according to claim 1, wherein said identifier is a figure suggestive of the shape of a corresponding member, the shape having a size smaller than a display image of the shape of said corresponding member.

3. The apparatus according to claim 2, further comprising memory means in which shapes of identifiers corresponding to respective ones of the plurality of members are stored in advance.

4. The apparatus according to claim 2, wherein said control means has means for reducing images of the shapes of the plurality of members and generating the reduced images as the identifiers.

5. The apparatus according to claim 1, wherein said control means displays an image of an identifier corresponding to the designated member in the vicinity of a centroid position of the displayed shape of the designated member.

6. The apparatus according to claim 5, wherein said control means includes:

memory means for storing, for each individual member, relative coordinates of centroid positions of the corresponding shapes; and converting means responsive to said designating means for converting the centroid position of the displayed shape of the designated member from a relative position read from said memory means to absolute coordinates on a display screen of the display means;

said identifier being displayed in the vicinity of the centroid position obtained by said converting means.

7. The apparatus according to claim 5, wherein said control means has arithmetic means responsive to said designating means for calculating the centroid position of the displayed shape of the designated member on the basis of absolute coordinates on a display screen of the display means;

said identifier being displayed in the vicinity of the centroid position calculated by said arithmetic means.

8. The apparatus according to claim 1, further comprising first instructing means operable by an operator in order to set the display apparatus to a first mode in which said control means is operable.

9. The apparatus according to claim 1, further comprising:

first instructing means for instructing, when display of a member has been replaced by display of the corresponding identifier, to hide display of the identifier and display the shape figure of the original member; and second designating means responsive to an instruction from said first instructing means for designating an identifier on a screen of the display means;

wherein said control means, in response to said second designating means, controls said display means to hide the designated identifier and to display the shape figure of the original member.

10. The apparatus according to claim 1, wherein said first designating means is a pointing device for designating any position on a display screen.

11. A display apparatus used in a CAD system for designing a work of a plurality of members, comprising:

display means for simultaneously displaying figures representing two and/or three dimensional shapes of respective ones of the plurality of members, wherein a shape figure of any member is displayed as elements of the work to be designed in the CAD system is capable of being hidden from view;

mode setting means for setting the display apparatus to a mode in which the shape of a hidden member is caused to be re-displayed;

designating means for allowing an operator to designate any position on a screen of the display means;

searching means for searching for a hidden member over a prescribed range based upon the position designated by the operator using said designating means; and control means for controlling the display means to display a shape figure of a hidden member situated in the vicinity of the position designated by the operator using said designating means.

12. The apparatus according to claim 11, wherein said searching means sets the range searched to a circular shape in a case where a displayed figure is a two-dimensional figure.

13. The apparatus according to claim 11, wherein said searching means sets the range searched to a cylindrical shape in a case where a displayed figure is a three-dimensional figure.

14. A control method for controlling display means used in a CAD system which simultaneously displays figures representing two and/or three dimensional shapes of respective ones of a plurality of members as elements of the work to be designed in the CAD system, comprising the steps of:

designating a specific member among the plurality of members; and controlling the display means to display an identifier which visually identifies the designated member within an area in which a shape of the designated member in said display means is displayed, in place of the shape of the designated member, said identifier being displayed in the vicinity of a centroid position of the displayed shape of the designated member.

15. The method according to claim 14, further comprising a step of previously storing shapes of identifiers corresponding to respective ones of the plurality of members.

16. The method according to claim 14, wherein said control step has a step of reducing images of the shapes of identifiers corresponding to respective ones of the plurality of members and generating the reduced images as said identifiers.

17. The method according to claim 14, wherein said control step displays an image of an identifier corresponding to the designated member in the vicinity of a centroid position of the displayed shape of the designated member.

18. The method according to claim 14, wherein said designating step is executed after the display means is set to a prescribed mode.

19. A method for simultaneously displaying figures representing two and/or three dimensional shapes of respective ones of a plurality of members and controlling display means used in a CAD system capable of hiding from view a shape figure of any displayed member which is displayed as elements of the work to be designed in the CAD system, comprising the steps of:

setting a mode in which the shape of a hidden member is caused to be re-displayed;

allowing an operator to designate any position on a screen of the display means;

searching for a hidden member over a Prescribed range based upon the designated position; and controlling the display means in such a manner that a shape figure of a hidden member situated in the vicinity of the designated position is displayed.

* * * * *

UNITED STATES PATENT AND TRADEMARK OFFICE
CERTIFICATE OF CORRECTION

PATENT NO. : 5,815,150
DATED : September 29, 1998
INVENTOR(S) : Kazuma Shimizu

It is certified that error appears in the above-indentified patent and that said Letters Patent is hereby corrected as shown below:

Col. 3, line 42, delete "dimentional" and insert --dimensional--.
Col. 5, line 42, after "will" insert --be--.
Col. 9, line 12, after "map" (first occurrence) insert --401--.
Col. 9, line 43, after "is" delete "1" and insert --3--.

Signed and Sealed this

Twenty-third Day of November, 1999

Attest:

Q. TODD DICKINSON

Attesting Officer

Acting Commissioner of Patents and Trademarks